Nov. 19, 1957 H. W. LEVERENZ 2,813,817
SEMICONDUCTOR DEVICES AND THEIR MANUFACTURE
Filed Sept. 20, 1952

INVENTOR.
Humboldt W. Leverenz

BY J. L. Whittaker
ATTORNEY 2,813,817

SEMICONDUCTOR DEVICES AND THEIR MANUFACTURE

Humboldt W. Leverenz, Princeton, N. J., assignor to Radio Corporation of America, a corporation of Delaware Application September 20, 1952, Serial No. 310,634

15 Claims. (Cl. 148—33)

This invention relates to semiconductor devices and particularly to improved methods and means for fabricating junction-type semiconductor devices.

In junction type semiconductor devices, a high impedance rectifying barrier is produced by a relatively low-melting-point impurity material alloyed and diffused into a wafer of suitably prepared semiconductor material, such as germanium, silicon, or the like. The impurity material is chosen such that, as an impurity in a semiconductor material of a given type conductivity, the local region of the semi-conductor wherein the materials are alloyed and diffused yields the opposite type of conductivity. For example, either indium, gallium, aluminum, or boron, when alloyed and diffused into an N-type semiconductor, imparts to the region penetrated P-type conductivity. In a like manner, the penetration of a P-type semiconductor by an impurity material such as phosphorus, arsenic, antimony, or bismuth imparts N-type conductivity to the semiconductor.

The elements of a typical semiconductor device such as a transistor include a base electrode, and emitter and collector electrodes. As a typical example, the base electrode may comprise a conductive element connected to one surface of a wafer of N-type germanium while the emitter and collector electrodes may each comprise similar conductive elements connected to a disk or pellet of indium diffused and alloyed into each of two opposite faces of the germanium wafer. This is known as a P–N–P device. In the fabrication of such devices, it is necessary that these electrodes be provided with terminal leads for connecting the device to an electrical circuit or to a suitable socket which, in turn, may be plugged into a circuit.

In the manufacture of such a junction transistor, as the two quantities of coaxially aligned impurity material penetrate the wafer or block of semiconductor, the leading surfaces thereof assume a generally convex spherical contour. In the completed device, therefore, the two convex spherical surfaces face each other with a varying spacing between them, the spacing being a minimum at the centers of the surfaces and a maximum at the peripheries. This structural arrangement, wherein there are paths of different lengths between the two regions containing the diffused impurities, raises the problem of varying charge transit time along these paths. Due to the varying lengths of these paths, current carriers following a path remote from the regions at a minimum spacing tend to migrate away from this region and are lost to the collector. Due to this loss, the gain of the device is reduced. In addition, the frequency response of such a device is adversely affected by a difference in transit time of current carriers following the various paths.

Accordingly, the principal object of this invention is to provide an improved semiconductor device and method of making such a device.

Another object is to provide an improved junction semiconductor device having uniform transit paths for current carriers flowing between emitter and collector regions.

A further object is to provide an improved semiconductor device having improved gain and frequency response.

In general the purposes and objects of this invention are accomplished by alloying and diffusing two differently shaped quantities of impurity substance into opposite surfaces of a block or wafer of semiconductor material of one type of conductivity. For example, one quantity, e. g., to form the emitter region, may be in the form of a pellet and the other, to form the collector region, may be in the form of an annulus. By this arrangement, the diffused surface of the pellet within the block of semiconductor has a generally convex spherical shape. On the other hand, the diffused surface of the annulus has a central concave portion which substantially surrounds the convex surface of the first region and thereby provides a large number of equal length transit paths between emitter and collector regions.

The invention is described with reference to the drawing wherein.

Similar reference characters are applied to similar elements throughout the drawings.

Figure 1:
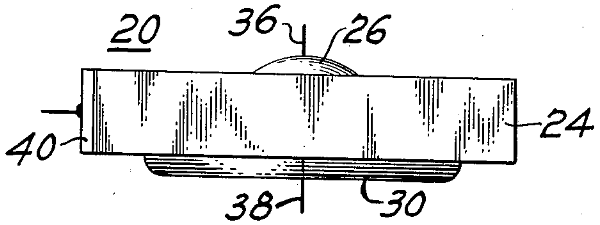
Fig. 1 shows a completed junction semiconductor device made according to this invention.
Figure 4:
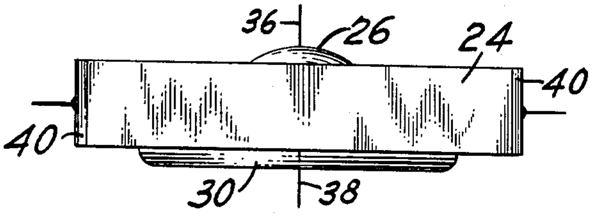
Fig. 4 shows an alternative arrangement of a portion of the device of the invention; and, Fig. 5 is a plan view of a further alternative arrangement of a portion of the device of the invention.
Figure 5:
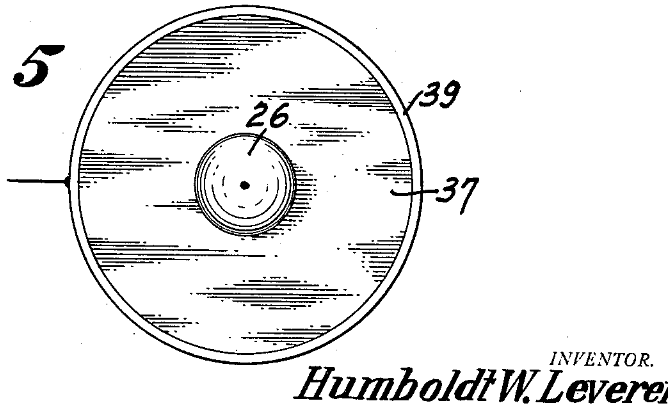

Referring to the drawing, in Fig. 1 is shown a completed junction semiconductor device 20 made according to the principles of this invention. The device comprises a block or wafer 24 of N-type or P-type germanium, silicon or the like having quantities of impurity substance 26 and 30 alloyed and diffused into opposite surfaces thereof. These diffused substances have electrode leads 36 and 38 connected thereto and become the emitter and collector regions in the completed device. A base electrode 40 is also connected to the block 24. For purposes of symmetry, two oppositely disposed base connections 40 may be made (Fig. 4). In some cases, for example where a circular disk of germanium 37 is employed instead of a block, the base electrode may be in the form of a ring 39 entirely surrounding the periphery of the disk (Fig. 5). If the wafer, of germanium, for example, is of N-type conductivity, the substance is selected for its ability to form, with the germanium, a rectifying barrier and a layer of P-type conductivity material. Suitable materials providing such conductivity include indium, gallium, aluminum, boron, and the like. If the germanium has P-type conductivity the alloying substance is chosen to yield a rectifying barrier and an N-type conductivity layer. Such substance may be phosphorus, arsenic, antimony, bismuth or the like.

Figure 2:
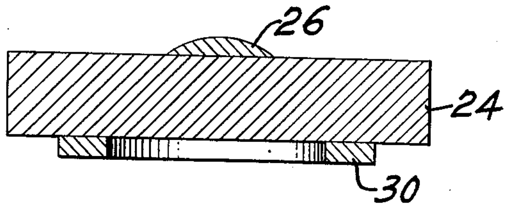
Fig. 2 is a sectional elevational view of the device of Fig. 1 at one stage in the manufacture thereof.
Figure 3:
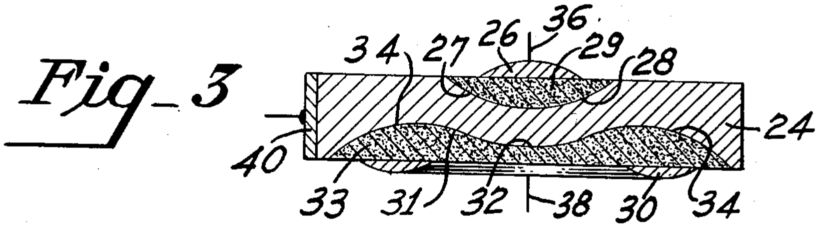
Fig. 3 is a sectional elevational view of the completed device shown in Fig. 1.

According to a detailed description of the method and the resulting device of the invention, referring to Figs. 2 and 3, a block of semiconductor material 24, for example of N-type germanium, has a pellet-shaped quantity of impurity substance 26, for example indium, alloyed and diffused into one surface thereof to form a diffusion junction which may be operated as an emitter region. The junction comprises a rectifying barrier 27 and a region 29 of P-type material. The pellet of indium diffuses into the surface of the block to form a generally convex spherical surface 28 within the block. A quantity of indium is also alloyed and diffused into the opposite surface of the block to form another diffusion junction which may be operated as a collector region. This junction also comprises a rectifying barrier 31 and a region 33 of P-type material. This quantity of impurity material, however, is in the form of an annulus 30 positioned substantially concentrically with the pellet of indium 26. This positioning may be effected by a modification of the teaching of Mueller in application Serial No. 295,304, filed June 24, 1952 and assigned to the assignee of this application. According to this method, graphite washers, having correctly aligned openings, are used to position the indium to be diffused. When the annulus of indium 30 diffuses into the surface of the germanium block the advancing surface of the diffusing material has an undulating shape with a central concavity 32 and a peripheral convexity 34. Since the two quantities of semiconductor material were originally positioned concentrically, the central concavity 32 of the indium annulus is aligned with and substantially surrounds the convex surface 28 of the diffused pellet 26. Thus a large number of paths of substantially equal length are formed between emitter and collector and the collector surrounds the emitter whereby effective collection of current carrying charges is effected and comparatively little loss is experienced due to lateral migration away from the emitter-collector region.

The above-mentioned alloying and diffusion may be achieved by a method described by Mueller in application Serial No. 294,741 filed June 20, 1952 and assigned to the assignee of this application. According to this method, initially the germanium wafer 24 is etched in a solution comprising 4 cc. of hydrofluoric acid, 2 cc. of concentrated nitric acid, and 200 milligrams of cupric nitrate in 4 cc. of water. After etching, the germanium wafer is washed with distilled water at room temperature and dried in a blast of hot air, the air being at a temperature of approximately 60° C. The pellet of impurity material 26, such as indium, is placed on one side of the wafer and the ensemble is heated in a reducing atmosphere at a temperature of approximately 200° C. for one minute so that the indium melts and "wets" the germanium. The indium annulus 30 is then placed on the opposite face of the germanium wafer and the unit is heated in a reducing atmosphere at a temperature in the range of 400° C. to 500° C. for ten to twenty minutes whereby the pellet 26 and annulus 30 are alloyed with and diffused into the germanium block 24. In this operation, initially, the indium melts and alloys with the germanium. The alloying continues until the concentration of indium in germanium below the surface is insufficient to cause the indium to alloy with the germanium. At this time some solid diffusion occurs, further increasing the depth of penetration.

Finally, electrode connections are made to complete the device and prepare it for operation. Such connections are made by soldering or otherwise mounting the conductive leads 36, 38, 40 on the block 24 and the two portions of alloyed material respectively. In operation of the device, the electrode lead 40 is operated as the base electrode and the electrodes 36 and 38 are operated as emitter and collector respectively. If desired, the roles of electrodes 36 and 38 may be reversed and 38 may be operated as the emitter and 36 as the collector as is well known in the art.

The principles of this invention may also be applied to semiconductor devices in which the zones or regions of different conductivity types, i. e. N-type and P-type regions, are formed during the growth of the crystal from which the main body of the semiconductor device is made.

What is claimed is:

1. A semiconductor device comprising a body of semiconductor material including a first region of one conductivity type between two other regions of conductivity of a type opposite to that of said first region whereby two P–N junctions are present, the interface between said first region and one of said other regions being curved concavely with respect to the other one of said other regions and the interface between said first region and the other one of said other regions being curved convexly with respect to said one of said other regions and the two interfaces being substantially concentric to each other.

2. A semiconductor device comprising a wafer of semi-conductor material, a first quantity of conductivity type determining impurity substance alloyed and diffused into one surface thereof and forming a first rectifying barrier in said wafer, another quantity of said impurity substance alloyed and diffused into another surface thereof and forming a second rectifying barrier in said wafer, said rectifying barriers being in operative relationship with each other within said wafer, one of said rectifying barriers having a generally convex form and the other of said rectifying barriers having a generally concave form substantially surrounding said barrier of convex form, the distance between said convex and concave barriers being substantially uniform at all points within a predetermined region.

3. A semiconductor device comprising a wafer of semi-conductor material of one type of conductivity, a first quantity of impurity substance capable of imparting to said material conductivity of opposite type alloyed and diffused into one surface thereof and forming a first rectifying barrier and a region of conductivity of said opposite type in said wafer, another quantity of said impurity substance alloyed and diffused into another surface of said wafer and forming a second rectifying barrier and a region of opposite conductivity type in said wafer, said barriers being positioned in operative relationship with each other within said wafer, said first rectifying barrier having a generally convex form and said second rectifying barrier having a central concavity and a peripheral convexity, said central concavity substantially surrounding said convex surface and being spaced therefrom so that the transit paths between said surfaces are of substantially uniform length.

4. A semiconductor device comprising a wafer of semiconductor material, a pellet-shaped portion of a conductivity type determining impurity substance alloyed and diffused into one surface thereof, an annular shaped portion of said impurity substance alloyed and diffused into another surface thereof, said portions forming two rectifying barriers disposed in operative relationship with each other in said wafer, one of said barriers having a generally convex form with respect to the other while the latter has a generally concave form with respect to it and said two barriers being substantially concentric with each other.

5. A semiconductor device comprising a wafer of semiconductor material of one type of conductivity, a pellet-shaped quantity of a conductivity type determining impurity substance alloyed and diffused into one surface of said wafer and forming a rectifying barrier and a region of opposite conductivity type in said wafer, an annular shaped quantity of impurity substance alloyed and diffused into another surface of said wafer and forming a rectifying barrier and a region of opposite type conductivity type in said wafer, said barriers being positioned in operative relationship with each other, one of said barriers having a generally convex form and the other of said barriers having a central concavity and a peripheral convexity, said central concavity substantially surrounding said convex shaped barrier and being uniformly spaced therefrom so that the transit paths between said barriers within a particular region are of substantially uniform length.

6. A semiconductor device comprising a wafer of N-type semiconductor material of the group consisting of germanium and silicon, a first quantity of impurity substance alloyed and diffused into one surface thereof and forming a first rectifying barrier in said wafer, another quantity of impurity substance alloyed and diffused into another surface thereof and forming a second rectifying barrier in said wafer, each of said quantities comprising one member of the group consisting of indium, gallium, aluminum, and boron, said barriers being positioned in operative relationship within said wafer, one of said barriers having a generally convex form and the other of said barriers having a generally concave form substantially enveloping said barrier of convex form, said barriers being substantially uniformly spaced apart at all points of the area of said convex barrier.

7. A semiconductor device comprising a wafer of P-type semiconductor material of the group consisting of germanium and silicon, a first quantity of impurity substance alloyed and diffused into one surface thereof and forming a rectifying barrier in said wafer, another quantity of impurity substance alloyed and diffused into another surface thereof and forming a rectifying barrier in said wafer in operative relationship with said first-mentioned barrier, each of said substances comprising one member of the group consisting of phosphorus, arsenic, antimony and bismuth, one of said barriers having a generally convex form with respect to the other and at least a portion of said other barrier having a generally concave form with respect to said one of convex form and being substantially concentric therewith.

8. An electrical device comprising a body of semiconductor material having disposed therein two P–N junctions, one of said junctions being curved convexly with respect to a point located between said junctions and the other of said junctions being curved concavely with respect to said point.

9. A semiconductor device comprising a body of semiconductor material including a plurality of zones of different conductivity types with P–N junctions constituting the interfaces between said zones, said junctions being curved and the distance between said junctions being substantially uniform at all points within a predetermined area.

10. An electrical device comprising a body of semiconductor material, a first P–N junction within said body having a generally convex surface and a second P–N junction within said body having a generally concave surface substantially surrounding said convex surface, the distance between said convex and concave surfaces being substantially uniform at all points of said convex surface.

11. A semiconductor device comprising a wafer of semiconductor material, and two rectifying electrodes, one of said electrodes being disposed on one major face of said wafer and defining a first rectifying barrier in said wafer, the other one of said electrodes being disposed on the other major face of said wafer in coaxial alignment with the first electrode, said other electrode defining a second rectifying barrier having a curved surface partially surrounding and concave with respect to said first rectifying barrier, and said first rectifying barrier being convex with respect to said second rectifying barrier and substantially concentric therewith.

12. The method of making a semiconductor device comprising the steps of alloying and diffusing a pellet-shaped quantity of an opposite conductivity type determining impurity substance into one surface of a semiconductor body to form a first rectifying barrier of generally convex shape, and alloying and diffusing an annular shaped quantity of an opposite conductivity type determining impurity substance into another surface of said body in coaxial alignment with said first rectifying barrier to form a second rectifying barrier of generally concave shape having a portion of concave shape which substantially surrounds said barrier of convex shape and is equidistant therefrom at all points within a predetermined region.

13. Method of making a semiconductor device comprising the steps of surface alloying an electrode pellet of an opposite conductivity type determining impurity substance upon one surface of a semiconductor wafer to produce a rectifying barrier which is convex toward the other surface of the wafer, and surface alloying an electrode annulus of an opposite conductivity type determining impurity substance upon the surface of said wafer opposite said one surface, said annulus being placed in coaxial alignment with said pellet, said annulus being surface alloyed at a temperature sufficiently high so that the conductivity of the entire area of said surface encompassed by said annulus is effected by said annulus alloying and a rectifying barrier is formed in said wafer over the area corresponding to the entire area of said annulus including the aperture thereof, the central portion of said barrier having a concave and substantially concentric curvature with respect to the rectifying barrier produced by the alloying of said electrode pellet.

14. Method of making a semiconductor device comprising the steps of surface alloying an opposite conductivity-type-determining electrode pellet upon one surface of a semiconductor wafer to produce an inwardly convex rectifying interface, and surface alloying an opposite conductivity-type-determining electrode annulus upon the surface of said wafer opposite said one surface, said annulus being placed in coaxial alignment with said pellet to produce a rectifying interface which is concave toward it and concentric with it.

15. The method of making a semiconductor device comprising the steps of positioning a pellet of an opposite-conductivity-type-determining impurity substance on one surface of a semiconductor body of one conductivity type, positioning an annulus of an opposite-conductivity-type-determining impurity substance on another surface of said body substantially coaxially with said pellet, and heating said pellet and annulus to form rectifying barriers in said body whereby the leading surface of said pellet has a convex shape and the leading surface of said annulus has a central concavity and a peripheral convexity, said central concavity substantially surrounding said convex surface whereby the distance between said leading surfaces is substantially the same at all points along said surfaces.

References Cited in the file of this patent

UNITED STATES PATENTS

| | | |
|---|---|---|
| 2,563,503 | Wallace | Aug. 7, 1951 |
| 2,586,080 | Pfann | Feb. 19, 1952 |
| 2,644,852 | Dunlap | July 7, 1953 |